United States Patent
Kwon et al.

(10) Patent No.: US 9,184,253 B2
(45) Date of Patent: Nov. 10, 2015

(54) THIN FILM TRANSISTOR SUBSTRATE AND DISPLAY DEVICE HAVING THE SAME

(71) Applicant: Samsung Display Co., LTD., Yongin, Gyeonggi-Do (KR)

(72) Inventors: Do-Hyun Kwon, Seongnam-si (KR); Min-Jung Lee, Seoul (KR); Sung-Eun Lee, Seoul (KR); Il-Jeong Lee, Seoul (KR); Jung-Kyu Lee, Seoul (KR); Kwang-Young Choi, Incheon (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/156,624

(22) Filed: Jan. 16, 2014

(65) Prior Publication Data

US 2015/0034912 A1    Feb. 5, 2015

(30) Foreign Application Priority Data

Jul. 31, 2013  (KR) .................. 10-2013-0090563

(51) Int. Cl.
*H01L 29/49*   (2006.01)
*H01L 29/423*  (2006.01)
*H01L 27/32*   (2006.01)

(52) U.S. Cl.
CPC ...... *H01L 29/4908* (2013.01); *H01L 29/42384* (2013.01); *H01L 27/3262* (2013.01)

(58) Field of Classification Search
CPC .............. H01L 27/1225; H01L 27/124; H01L 27/3244; H01L 29/78645; H01L 29/7869; H01L 29/78648; H01L 29/786; H01L 29/66742; H01L 29/4908
USPC .......................................... 257/40
See application file for complete search history.

(56) References Cited

U.S. PATENT DOCUMENTS

| | | | |
|---|---|---|---|
| 6,011,274 A * | 1/2000 | Gu et al. .................. 257/59 |
| 8,212,284 B2 * | 7/2012 | Akimoto et al. ............. 257/140 |
| 2003/0129791 A1 | 7/2003 | Yamazaki | |
| 2005/0001210 A1 | 1/2005 | Lee et al. | |
| 2007/0072439 A1 * | 3/2007 | Akimoto et al. ............. 438/795 |
| 2011/0223697 A1 * | 9/2011 | Yong-Hwan et al. ......... 438/28 |
| 2012/0248451 A1 * | 10/2012 | Sone et al. .................. 257/59 |

FOREIGN PATENT DOCUMENTS

| | | |
|---|---|---|
| KR | 1020050004565 A | 1/2005 |
| KR | 1020060098255 A | 9/2006 |

* cited by examiner

*Primary Examiner* — Mamadou Diallo
*Assistant Examiner* — Christina Sylvia
(74) *Attorney, Agent, or Firm* — Cantor Colburn LLP (57) ABSTRACT

A thin film transistor substrate includes a semiconductor pattern on a base substrate, a first insulation member disposed on the semiconductor pattern, a second insulation pattern disposed on the first insulation member, and a gate electrode disposed on the first insulation member and the second insulation pattern. The second insulation pattern overlaps a first end portion of the semiconductor pattern, and exposes a second end portion of the semiconductor pattern opposite to the first end portion. The gate electrode overlaps both the first insulation member and the second insulation pattern.

17 Claims, 9 Drawing Sheets

THIN FILM TRANSISTOR SUBSTRATE AND DISPLAY DEVICE HAVING THE SAME

This application claims priority to Korean Patent Application No. 10-2013-0090563, filed on Jul. 31, 2013, and all the benefits accruing therefrom under 35 U.S.C. §119, the contents of which in its entirety is herein incorporated by reference.

BACKGROUND

1. Field

Exemplary embodiments of the invention relate to a thin film transistor substrate, a display device having the same and a method of manufacturing the same. More particularly, exemplary embodiments of the invention relate to a thin film transistor substrate, a display device having the same and a method of manufacturing the same capable of improving reliability of a switching element.

2. Description of the Related Art

An organic light emitting display ("OLED") element may include a layer of organic materials between two electrodes, that is, an anode and a cathode. Positive holes from the anode may be coupled with electrons from the cathode, in the organic layer between the anode and the cathode, to emit light. The OLED element may have a variety of advantages such as a wide viewing angle, a rapid response rate, relatively thin thickness and low power consumption.

An OLED device may include a switching element to control the OLED element. For example, the switching element may include a thin film transistor. The thin film transistor may include a gate electrode, a source electrode, a drain electrode and a channel layer.

Technologies have been developed for a display device to have a high resolution. In order to implement such a high resolution, the display device may include switching elements having very small sizes.

However, when the size of the thin film transistor is overly small, dispersion of electrical characteristics of the thin film transistor may increase due to very short channel length of the thin film transistor.

Also, electrons may be transported through the very short channel layer to generate a hot carrier phenomenon, when a drain voltage is applied to the drain electrode while the gate electrode is turned off.

SUMMARY

One or more exemplary embodiment of the invention provides a thin film transistor substrate, a display device having the same, and a method of manufacturing the same, capable of improving dispersion of electrical characteristics of a thin film transistor having a very short channel layer and capable of reducing a hot carrier.

In an exemplary embodiment of a thin film transistor substrate according to the invention, the thin film transistor substrate includes a semiconductor pattern disposed on a base substrate, a first insulation member disposed on the semiconductor pattern, a second insulation pattern disposed on the first insulation member, and a gate electrode disposed on the first insulation member and the second insulation pattern. The second insulation pattern overlaps a first end portion of the semiconductor pattern. The gate electrode overlaps both the first insulation member and the second insulation pattern.

In an exemplary embodiment, the first insulation member may include a material having a dielectric constant greater than about 10.

In an exemplary embodiment, the first insulation member may include at least one of zirconium oxide, hafnium oxide, titanium oxide and aluminum oxide.

In an exemplary embodiment, a boundary of the first insulation member may substantially coincide with a boundary of the semiconductor pattern.

In an exemplary embodiment, the first insulation member may cover substantially an entirety of the base substrate.

In an exemplary embodiment, a boundary of a first end portion of the second insulation pattern may coincide with a boundary of the first end portion of the semiconductor pattern.

In an exemplary embodiment, the second insulation pattern may include silicon oxide or silicon nitride.

In an exemplary embodiment, the thin film transistor substrate may further include an inorganic insulation layer covering the gate electrode, a drain electrode disposed on the inorganic insulation layer and a source electrode disposed on the inorganic insulation layer. The drain electrode may overlap the first end portion of the semiconductor pattern. The source electrode may overlap a second end portion of the semiconductor pattern.

In an exemplary embodiment, the drain electrode may be electrically connected to the semiconductor pattern through a first contact hole penetrating the inorganic insulation layer, the second insulation pattern and the first insulation member, and the source electrode may be electrically connected to the semiconductor pattern through a second contact hole penetrating the inorganic insulation layer and the first insulation member.

In an exemplary embodiment, a depth of the first contact hole may be substantially greater than a depth of the second contact hole.

In an exemplary embodiment of a display device according to the invention, the display device includes a thin film transistor substrate and an organic light emitting structure disposed on the thin film transistor substrate. The thin film transistor substrate includes a semiconductor pattern disposed on a base substrate, a first insulation member disposed on the semiconductor pattern, a second insulation member disposed on the first insulation member, and a gate electrode disposed on the first insulation member and the second insulation pattern. The second insulation member overlaps a first end portion of the semiconductor pattern. The gate electrode overlaps both the first insulation member and the second insulation pattern. The organic light emitting structure includes a pair of electrodes facing each other and an organic light emitting layer disposed between the pair of electrodes.

In an exemplary embodiment, the first insulation member may include a material having a dielectric constant greater than about 10.

In an exemplary embodiment, a boundary of the first insulation member may substantially coincide with a boundary of the semiconductor pattern.

In an exemplary embodiment, a boundary of a first end portion of the second insulation pattern may coincide with a boundary of the first end portion of the semiconductor pattern.

In an exemplary embodiment, the thin film transistor substrate may further include an inorganic insulation layer covering the gate electrode, a drain electrode disposed on the inorganic insulation layer and a source electrode disposed on the inorganic insulation layer. The drain electrode may overlap the first end portion of the semiconductor pattern. The source electrode may overlap the second end portion of the semiconductor pattern.

In an exemplary embodiment, the drain electrode may be electrically connected to the semiconductor pattern through a first contact hole penetrating the inorganic insulation layer, the second insulation pattern and the first insulation member, and the source electrode may be electrically connected to the semiconductor pattern through a second contact hole penetrating the inorganic insulation layer and the first insulation member.

In an exemplary embodiment, a depth of the first contact hole may be substantially greater than a depth of the second contact hole.

In an exemplary embodiment of a method of manufacturing a thin film transistor substrate according to the invention, a semiconductor layer, a first insulation layer and a second insulation layer are sequentially formed on a base substrate. A first photoresist pattern is formed on the second insulation layer. The first photoresist pattern has a first thickness portion, and a second thickness portion thinner than the first thickness portion. Exposed portions of the second insulation layer, the first insulation layer and the semiconductor layer are removed using the first photoresist pattern as a mask to form an intermediate insulation pattern, a first insulation pattern and a semiconductor pattern, respectively. An entirety of the first photoresist pattern is reduced by a thickness of the second thickness portion, to form a second photoresist pattern having a third thickness expose a portion of the intermediate insulation pattern. The exposed portion of the intermediate insulation pattern is removed using the second photoresist pattern as a mask to form a second insulation pattern from the intermediate insulation pattern. A gate electrode is formed on the first insulation pattern and the second insulation pattern. The gate electrode overlaps both the first insulation pattern and the second insulation pattern.

In an exemplary embodiment, the first insulation pattern may include a material having a dielectric constant greater than about 10.

In an exemplary embodiment, an inorganic insulation layer may be further formed on the base substrate on which the gate electrode is formed. A first contact hole partially exposing a first end portion of the semiconductor pattern and a second contact hole partially exposing a second end portion of the semiconductor pattern may be further formed. The first contact hole may penetrate the inorganic insulation layer, the second insulation pattern and the first insulation pattern. The second contact hole may penetrate the inorganic insulation layer and the first insulation pattern. A drain electrode and a source electrode may be further formed. The drain electrode may be electrically connected to the first end portion of the semiconductor pattern through the first contact hole. The source electrode may be electrically connected to the second end portion of the semiconductor pattern through the second contact hole.

According to one or more exemplary embodiment of the thin film transistor substrate, the display device having the same, and the method of manufacturing the same, the gate insulation layer between the semiconductor pattern and the gate electrode of the thin film transistor may have a relatively high dielectric constant, thereby improving dispersion of electrical characteristics of the thin film transistor.

Also, the drain region insulation pattern may be disposed between the gate insulation layer and the gate electrode, and the first contact hole in the drain region may be deeper than the second contact hole in the source region, thereby reducing a hot carrier through the short channel layer.

Furthermore, the drain region insulation pattern may be formed by the photoresist pattern using the half-toned mask, thereby reducing manufacturing cost of the thin film transistor substrate due to an additional mask.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

Figure 1:
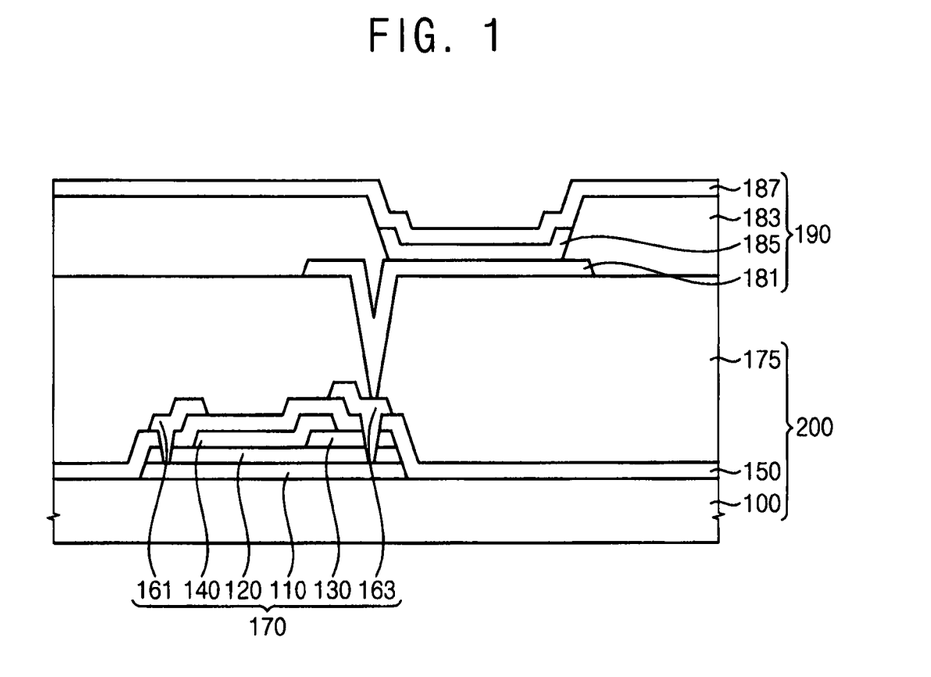
FIG. 1 is a cross-sectional view illustrating an exemplary embodiment of a display device in accordance with the invention.

FIG. 1 is a cross-sectional view illustrating an exemplary embodiment of a display device in accordance with the invention.

Referring to FIG. 1, a display device includes a thin film transistor substrate 200, and an organic light emitting structure 190 disposed on the thin film transistor substrate 200.

The thin film transistor substrate 200 may include a base substrate 100, a thin film transistor 170 disposed on the base substrate 100 and an organic insulation layer 175 disposed on the thin film transistor 170. The thin film transistor 170 may include a semiconductor pattern 110, a first insulation pattern 120, a second insulation pattern 130, a gate electrode 140, an inorganic insulation layer 150, a source electrode 161 and a drain electrode 163.

The base substrate 100 may include a transparent insulation material. In one exemplary embodiment, for example, the base substrate 100 may include glass, quartz, plastic, polyethylene terephthalate resin, polyethylene resin, polycarbonate resin, etc. Also, the base substrate 100 may include a flexible material.

The semiconductor pattern 110 may be disposed on the base substrate 100. The semiconductor pattern 110 may include a silicon material. In one exemplary embodiment, for example, the semiconductor pattern 110 may include amorphous silicon, polycrystalline silicon, etc.

The first insulation pattern 120 may be disposed on the semiconductor pattern 110. The first insulation pattern 120 may entirely overlap the semiconductor pattern 110. In one exemplary embodiment, for example, a boundary of the first insulation pattern 120 may substantially coincide with a boundary of the semiconductor pattern 110. The first insulation pattern 120 may include a material having a high dielectric constant. In one exemplary embodiment, for example, the first insulation pattern 120 may include a material having a dielectric constant between about 10 and about 100. In one exemplary embodiment, for example, the first insulation pattern 120 may include zirconium oxide (ZrO2), hafnium oxide (HfO2), titanium oxide (TiO2), aluminum oxide (Al2O3), etc.

The first insulation pattern 120 may have a single layer structure or a multiple layer structure. In one exemplary embodiment, for example, the first insulation pattern 120 may include at least one layer having the high dielectric constant. Alternatively, the first insulation pattern 120 may include a plurality of layers, including a first layer having the high dielectric constant, and a second layer having silicon oxide (SiOx), silicon nitride (SiNx), etc. and stacked on the first layer.

As mentioned above, the first insulation pattern 120 having a relatively high dielectric constant may be disposed on the semiconductor pattern 110, thereby improving dispersion of electrical characteristics of the thin film transistor 170 including the semiconductor pattern 110. In one exemplary embodiment, for example, a threshold voltage of a metal oxide silicon field effect transistor ("MOSFET") may have a relationship with a capacitance of an insulation layer in the MOSFET as Equation 1, $$V_T \propto \frac{1}{C_{ox}}, \qquad \text{Equation 1}$$

wherein $V_T$ represents a threshold voltage of a transistor, and $C_{ox}$ represents a capacitance of an insulation layer between a channel layer and a gate electrode of the transistor. Since the capacitance is proportional to a dielectric constant of the insulation layer, the threshold voltage of the transistor may decrease to improve dispersion of electrical characteristics of the transistor when the insulation layer in the transistor has a high dielectric constant.

The second insulation pattern 130 may be disposed on the first insulation pattern 120. The second insulation pattern 130 may overlap a first end portion of the first insulation pattern 120. In one exemplary embodiment, for example, a boundary of a first end portion of the second insulation pattern 130 may substantially coincide with a boundary of the first end portion of the first insulation pattern 120. The second insulation pattern 130 may include an inorganic insulation material. In one exemplary embodiment, for example, the second insulation pattern 130 may include silicon oxide (SiOx), silicon nitride (SiNx), etc. In an exemplary embodiment, for example, the second insulation pattern 130 may include silicon oxynitride (SiON).

The gate electrode 140 may be disposed on the first insulation pattern 120 and the second insulation pattern 130. A first portion of the gate electrode 140 may overlap the first insulation pattern 120, and a second portion of the gate electrode 140 may overlap both the first insulation pattern 120 and the second insulation pattern 130. A gate line (not illustrated in the figure) may be physically and/or electrically connected to the gate electrode 140, and a gate on/off signal may be applied to the gate electrode 140 through the gate line. In one exemplary embodiment, for example, the gate electrode 140 and the gate line may form a single, unitary, indivisible member, so as to be integrally formed with each other.

The inorganic insulation layer 150 may be disposed on the base substrate 100 on which the gate electrode 140 is disposed. The inorganic insulation layer 150 may cover the gate electrode 140. The inorganic insulation layer 150 may include, for example, silicon oxide (SiOx), silicon nitride (SiNx), etc.

A second contact hole CNT2 may be defined in the inorganic insulation layer 150 and the first insulation pattern 120. The source electrode 161 may be electrically connected to the semiconductor pattern 110 through the second contact hole CNT2 (refer to FIG. 2I) penetrating the inorganic insulation layer 150 and the first insulation pattern 120. A data signal may be applied to the source electrode 161 through a data line (not illustrated in the figure).

A first contact hole CNT1 may be defined in the insulation layer 150, the second insulation pattern 130 and the first insulation pattern 120. The drain electrode 163 may be electrically connected to the semiconductor pattern 110 through the first contact hole CNT1 (refer to FIG. 2I) penetrating the inorganic insulation layer 150, the second insulation pattern 130 and the first insulation pattern 120. The drain electrode 163 may include, for example, the same material as the source electrode 161. In the illustrated exemplary embodiment, a depth of the first contact hole CNT1 taken in the cross-sectional direction may be larger than a depth of the second contact hole CNT2 in the cross-sectional direction. The depths make be taken from a common surface, such as an upper surface of the semiconductor pattern 110.

As mentioned above, the second insulation pattern 130 may be disposed in a drain region of the thin film transistor 170, and the first contact hole CNT1 in the drain region may be deeper than the second contact hole CNT2 in the source region, thereby reducing a hot carrier through a short channel layer. Accordingly, reliability of the thin film transistor 170 may increase.

The organic insulation layer 175 may be disposed on the base substrate 100 on which the source electrode 161 and the drain electrode 163 are disposed. The organic insulation layer 175 may cover the source electrode 161 and the drain electrode 163. The organic insulation layer 175 may have a substantially flat surface.

The organic light emitting structure 190 may include a first electrode 181, an intermediate layer 185 and a second electrode 187. A pixel defining layer 183 may be disposed on the organic insulation layer 175 on which the first electrode layer 181 is disposed.

The first electrode 181 may be disposed on the base substrate 100 on which the organic insulation layer 175 is disposed. A third contact hole may be defined in the organic insulation layer 175. The first electrode 181 may be electrically connected to the drain electrode 163 through the third contact hole penetrating the organic insulation layer 175. The first electrode 181 may include, for example, a transparent electrode, a transreflective electrode, etc. In one exemplary embodiment, for example, the first electrode 181 may include indium zinc oxide ("IZO"), indium tin oxide ("ITO"), zinc oxide (ZnOx), tin oxide (SnOx), etc. In the illustrated exemplary embodiment, the first electrode 181 may be used as an anode to provide the organic light emitting structure 190 with positive holes.

The pixel defining layer 183 may be disposed on the organic insulation layer 175 on which the first electrode 181 is disposed. The pixel defining layer 183 may partially overlap both end portions of the first electrode 181. An opening may be defined in the pixel defining layer 183 and exposes the first electrode 181.

The intermediate layer 185 may be disposed on the first electrode 181 and in the opening of the pixel defining layer 183. The intermediate layer 185 may include a hole injection layer ("HIL"), a hole transfer layer ("HTL"), an emission layer ("EML"), an electron transfer layer ("ETL") and an electron injection layer ("EIL"), but the invention is not limited thereto. The first electrode 181 may provide the HIL and HTL with the positive holes. The second electrode 187 may provide the ETL and EIL with electrons. The positive holes and the electrons may be coupled in the EML to generate light having a desired wavelength. In an exemplary embodiment, the organic light emitting structure 190 may include light emitting materials which generate red light, green light, blue light, etc. Alternatively, the organic light emitting structure 190 may include a plurality of light emitting materials which generate different colored light having a desired wavelength.

The second electrode 187 may be disposed on the intermediate layer 185 and in the opening of the pixel defining layer 183. The second electrode 187 may also overlap the pixel defining layer 183, that is, portions of the pixel defining layer 183 which define the opening therein. The second electrode 187 may include, for example, the same material as the first electrode 181. In one exemplary embodiment, for example, the second electrode 187 may IZO, ITO, zinc oxide (ZnOx), tin oxide (SnOx), etc. In the illustrated exemplary embodiment, the second electrode 187 may be used as a cathode to provide the organic light emitting structure 190 with the electrons.

FIGS. 2A to 2L are cross-sectional views illustrating an exemplary embodiment of a method of manufacturing the display device of FIG. 1.

Figure 2A:
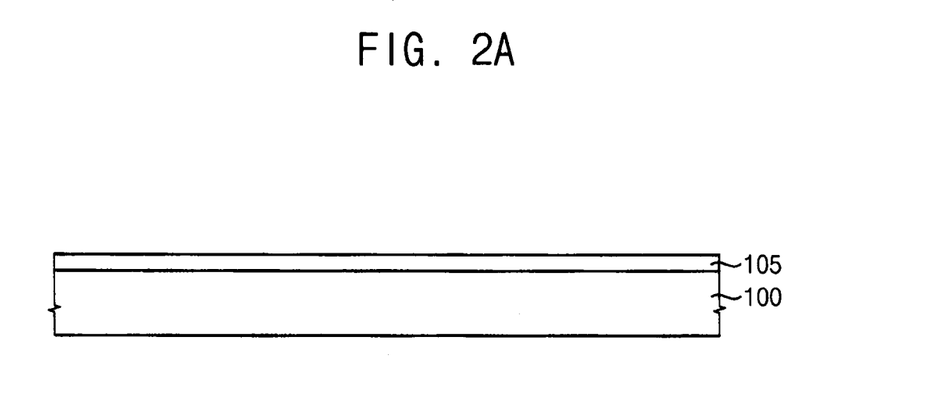
FIGS. 2A to 2L are cross-sectional views illustrating an exemplary embodiment of a method of manufacturing the display device of FIG. 1.
Figure 2B:
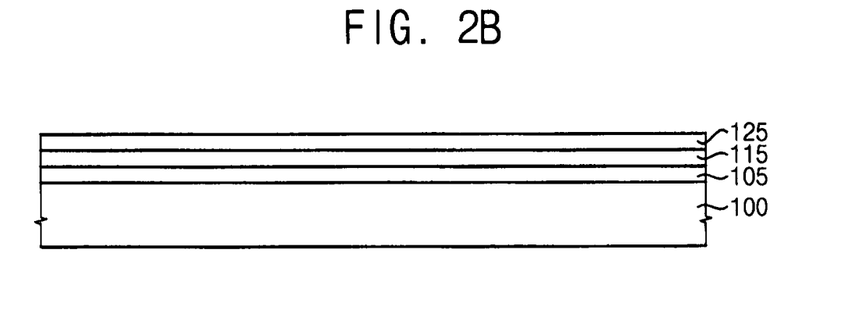

Referring to FIG. 2A and FIG. 2B, a semiconductor layer 105 may be formed on a base substrate 100. A first insulation layer 115 and a second insulation layer 125 may be formed on the semiconductor layer 105. The semiconductor layer 105 may include a silicon material. In one exemplary embodiment, for example, the semiconductor layer 105 may include amorphous silicon, polycrystalline silicon, etc.

The first insulation layer 115 may include a material having a high dielectric constant. In one exemplary embodiment, for example, the first insulation layer 115 may include a material having a dielectric constant greater than about 10. In an exemplary embodiment, for example, the first insulation layer 115 may include zirconium oxide (ZrO2), hafnium oxide (HfO2), titanium oxide (TiO2), aluminum oxide (Al2O3), etc. The first insulation layer 115 may have a single layer structure or a multiple layer structure. In one exemplary embodiment, for example, the first insulation layer 115 may include at least one layer having the high dielectric constant. Alternatively, the first insulation layer 115 may include a plurality of layers including a first layer including the high dielectric constant, and a second layer including silicon oxide (SiOx), silicon nitride (SiNx), etc. and stacked on the first layer.

The second insulation layer 125 may include an inorganic material. In one exemplary embodiment, for example, the second insulation layer 125 may include silicon oxide (SiOx), silicon nitride (SiNx), etc. In one exemplary embodiment, for example, the second insulation layer 125 may include silicon oxynitride (SiON).

Figure 2C:
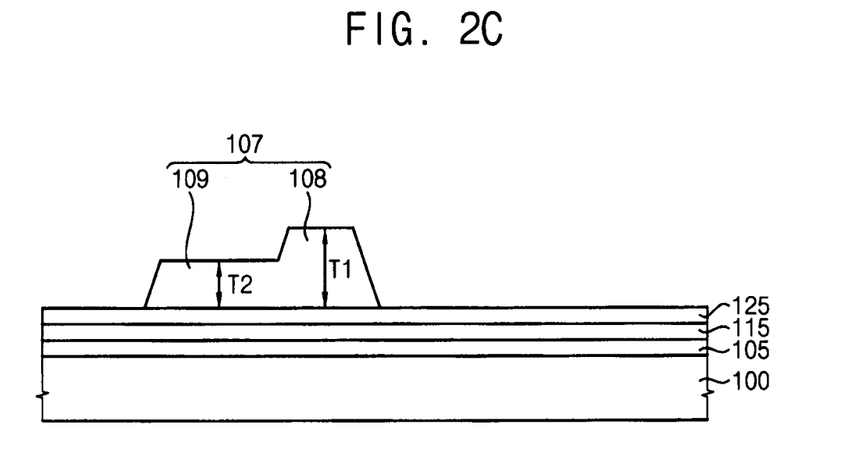

Referring to FIG. 2C, a first photoresist pattern 107 having a first thickness portion 108 and a second thickness portion 109 may be formed on the second insulation layer 125. A thickness T1 of the first thickness portion 108 may be substantially greater than a thickness T2 of the second thickness portion 109. The first photoresist pattern 107 may include, for example, a positive-type photoresist material of which a portion illuminated by a light is removed by a developer and of which a portion non-illuminated by the light remains on the second insulation layer 125. Alternatively, the first photoresist pattern 107 may include, for example, a negative-type photoresist material of which a portion non-illuminated by the light is removed by the developer and of which a portion illuminated by the light remains on the second insulation layer 125.

Figure 2D:
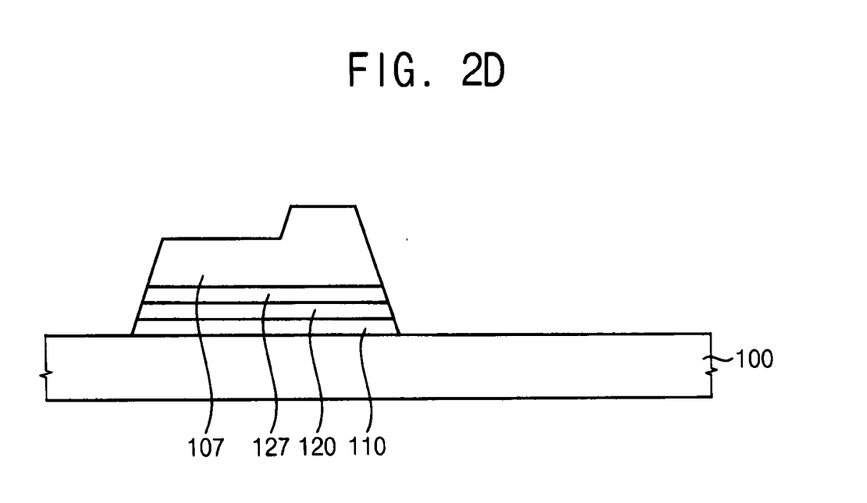

Referring to FIG. 2D, exposed portions of the second insulation layer 125, the first insulation layer 115 and the semiconductor layer 105 may be removed using the first photoresist pattern 107 as a mask. The exposed portion of the second insulation layer 125 may be removed to form an intermediate insulation pattern 127. The exposed portion of the first insulation layer 115 may be removed to form a first insulation pattern 120. The exposed portion of the semiconductor layer 105 may be removed to form a semiconductor pattern 110. A boundary of the first insulation pattern 120 may substantially coincide with a boundary of the semiconductor pattern 110.

Figure 2E:
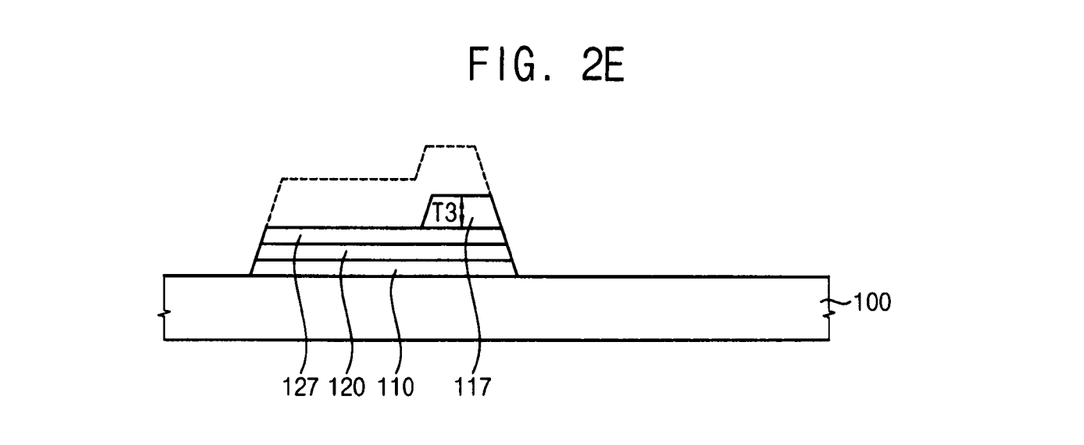

Referring to FIG. 2E, the first photoresist pattern 107 may be reduced over an entirety thereof by the thickness T2 of the second thickness portion 109. Accordingly, a second photoresist pattern 117 having a third thickness T3 less than both the first and second thicknesses T1 and T2, may be formed on the intermediate insulation pattern 127. In forming the second photoresist pattern 117, a portion of the intermediate insulation pattern 127 is exposed.

Figure 2F:
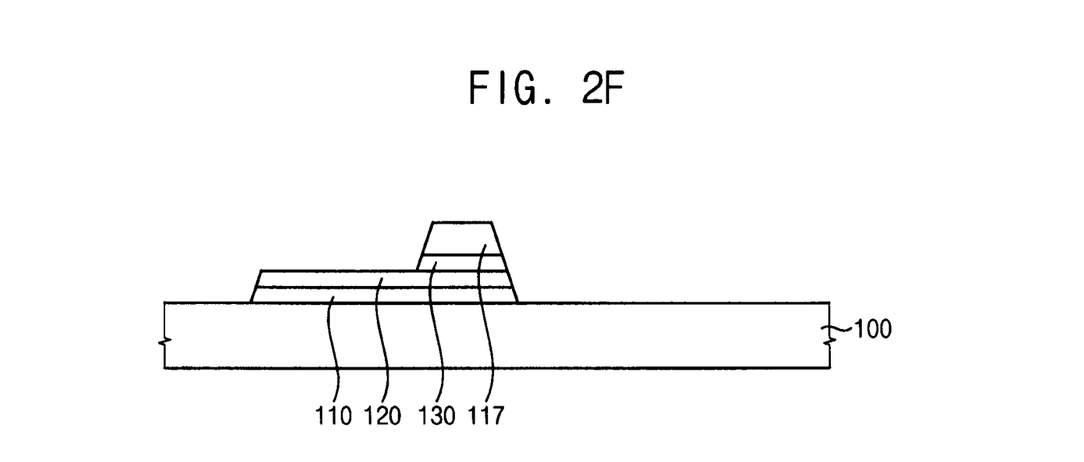

Referring to FIG. 2F, the portion of the intermediate insulation pattern 127 exposed by the second photoresist pattern 117 may be removed using the second photoresist pattern 117 as a mask. The exposed portion of the intermediate insulation pattern 127 may be removed to form a second insulation pattern 130. A boundary of a first end portion of the second insulation pattern 130 may substantially coincide with a boundary of a first end portion of the first insulation pattern 120. Also, the boundary of the first end portion of the second insulation pattern 130 may substantially coincide with a boundary of a first end portion of the semiconductor pattern 110.

Figure 2G:
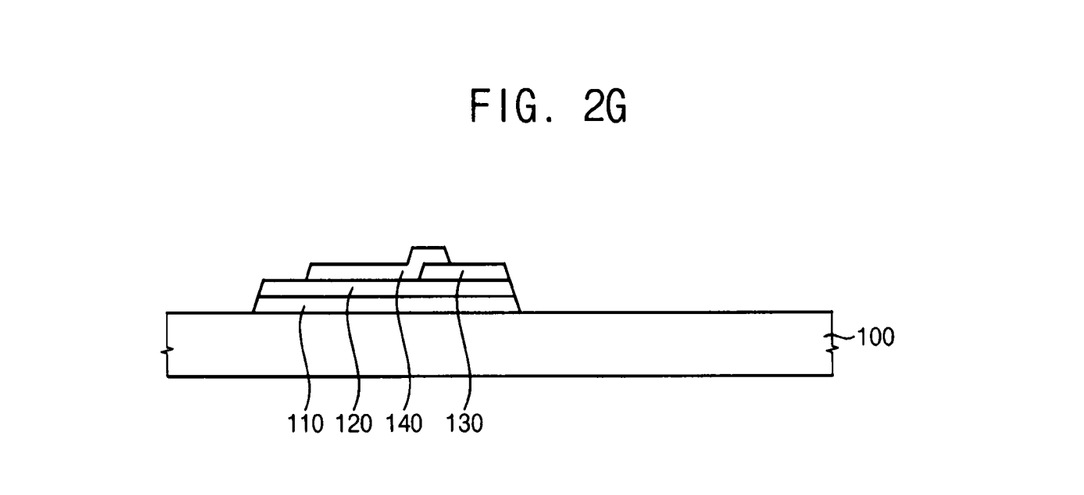

Referring to FIG. 2G, the second photoresist pattern 117 is removed, and a gate electrode 140 is formed on the first insulation pattern 120 and the second insulation pattern 130. A first portion of the gate electrode 140 may overlap the first insulation pattern 120. A second portion of the gate electrode 140 may overlap both the first insulation pattern 120 and the second insulation pattern 130.

Figure 2H:
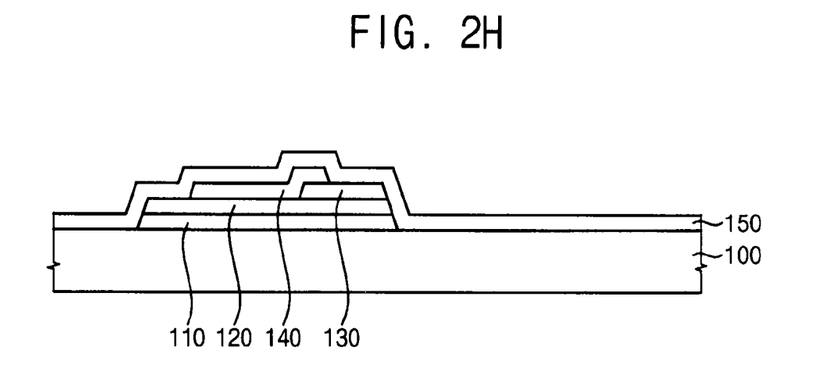

Referring to FIG. 2H, an inorganic insulation layer 150 may be formed on the base substrate 100 including the gate electrode 140 thereon. The inorganic insulation layer 150 may entirely cover the first insulation pattern 120, the second insulation pattern 130 and the gate electrode 140. The inorganic insulation layer 150 may include, for example, silicon oxide (SiOx), silicon nitride (SiNx), etc.

Figure 2I:
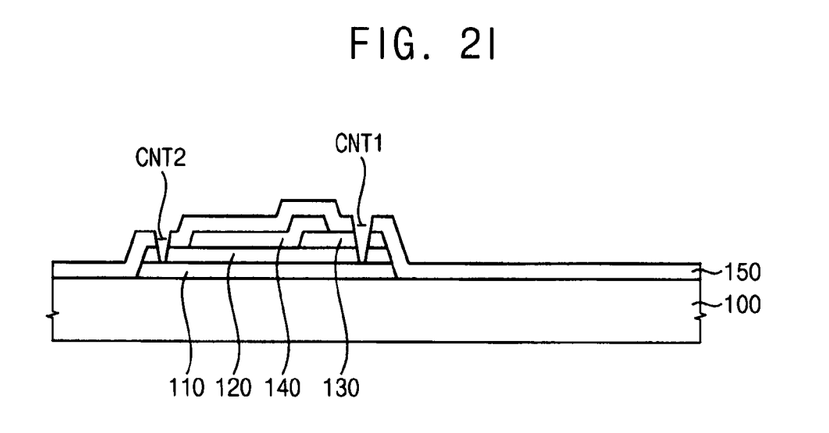
Figure 2J:
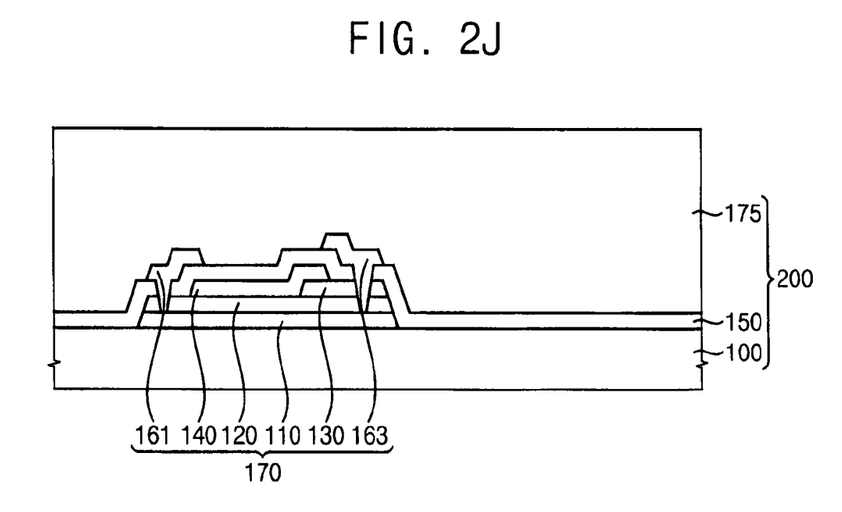

Referring to FIG. 2I and FIG. 2J, a first contact hole CNT1 and a second contact hole CNT2 each penetrating the inorganic insulation layer 150, the second insulation pattern 130 and/or the first insulation pattern 120 are formed. A drain electrode 163 and a source electrode 161 may be electrically connected to the semiconductor pattern 110 through the first contact hole CNT1 and the second contact hole CNT2, respectively. An organic insulation layer 175 may be formed on the base substrate 100 including the source electrode 161 and the drain electrode 163 thereon. The drain electrode 163 may be electrically connected to a first end portion of the semiconductor pattern 110 through the first contact hole CNT1 which penetrates the inorganic insulation layer 150, the second insulation pattern 130 and the first insulation pattern 120. The source electrode 161 may be electrically connected to a second end portion of the semiconductor pattern 110 through the second contact hole CNT2 which penetrates the inorganic insulation layer 150 and the first insulation pattern 120. A depth of the first contact hole CNT1 may be substantially greater than a depth of the second contact hole CNT2.

Figure 2K:
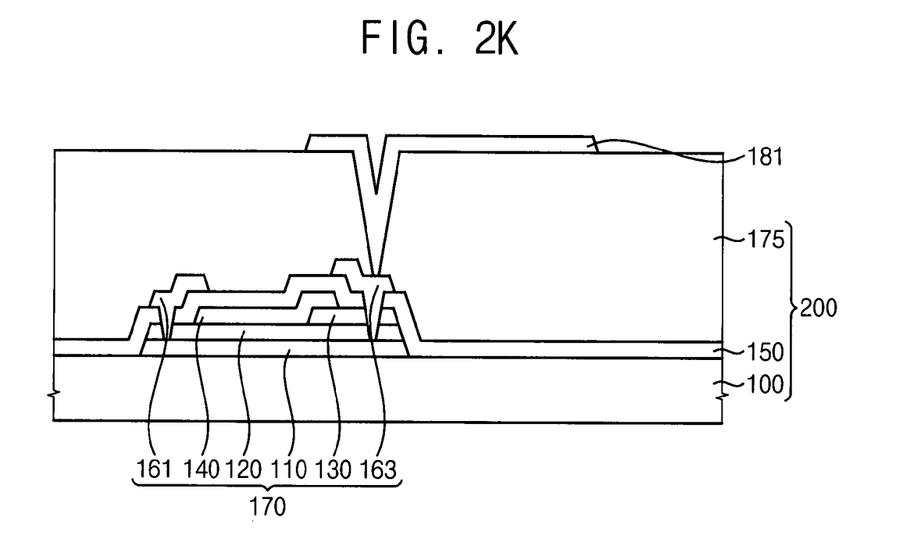

Referring to FIG. 2K, a third contact hole partially exposing the drain electrode 163 may be formed in the organic insulation layer 175, and a first electrode 181 may be formed in the third contact hole to contact an exposed portion of the drain electrode 163. The first electrode 181 may include, for example, IZO, ITO, zinc oxide (ZnOx), tin oxide (SnOx), etc.

Figure 2L:
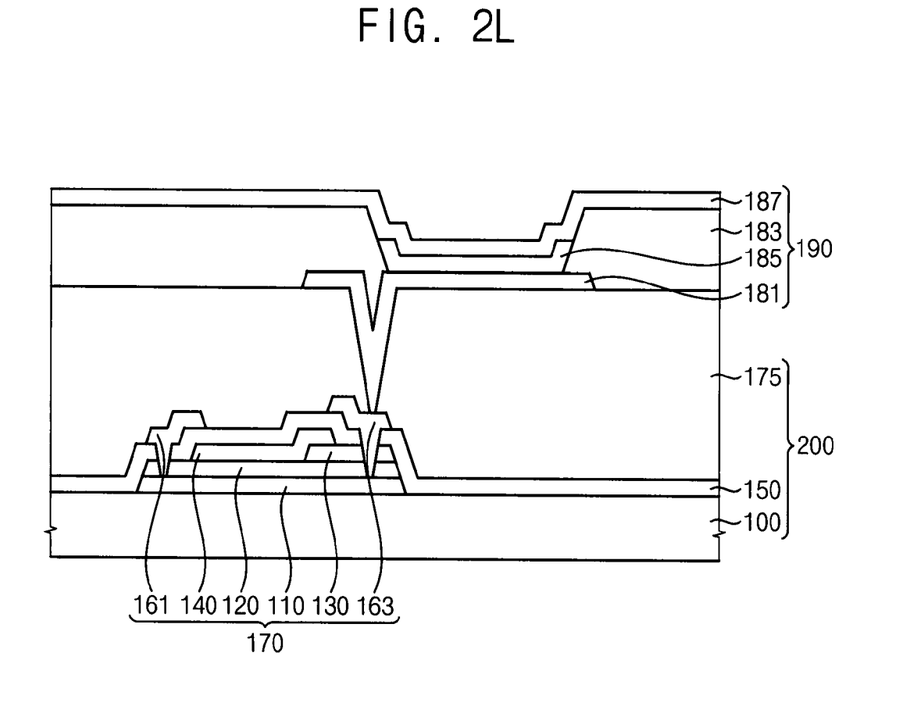

Referring to FIG. 2L, a pixel defining layer 183, an intermediate layer 185 and a second electrode 187 may be formed on the base substrate 100 including the first electrode 181 thereon. The intermediate layer 185 may include a HIL, a HTL, an EML, an ETL and an EIL. The second electrode 187 may include, for example, the same material as the first electrode 181.

As mentioned above, according to the illustrated exemplary embodiment of the thin film transistor substrate, the display device having the same and the method of manufacturing the same, the first insulation pattern 120 having a relatively high dielectric constant may be disposed on the semiconductor pattern 110, thereby improving dispersion of electrical characteristics of the thin film transistor 170 including the semiconductor pattern 110.

Also, the second insulation pattern 130 may be disposed in a drain region of the thin film transistor 170, and the first contact hole CNT1 in the drain region may be deeper than the second contact hole CNT2 in a source region, thereby reducing a hot carrier due to a short channel layer. Accordingly, reliability of the thin film transistor 170 may be improved.

Furthermore, the second insulation pattern 130 may be formed by a photoresist pattern using a half-toned mask, thereby reducing manufacturing cost of the thin film transistor substrate 200 due to an additional mask.

Figure 3:
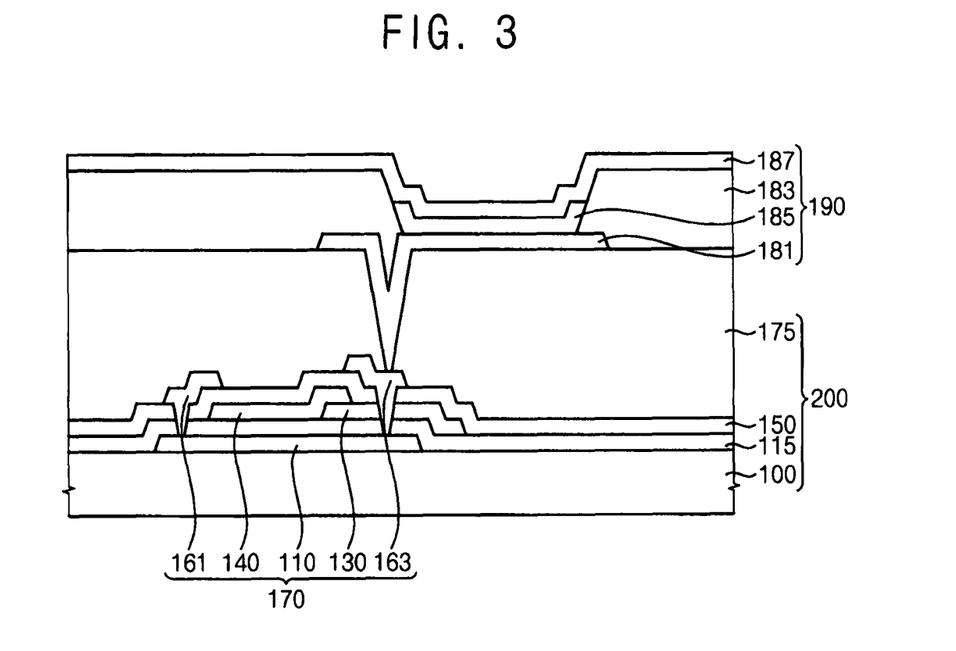
FIG. 3 is a cross-sectional view illustrating another exemplary embodiment of a display device in accordance with the invention.

FIG. 3 is a cross-sectional view illustrating another exemplary embodiment of a display device in accordance with the invention.

Referring to FIG. 3, a display device includes a thin film transistor substrate 200, and an organic light emitting structure 190 disposed on the thin film transistor substrate 200. The display device according to the illustrated exemplary embodiment is substantially the same as the display device illustrated in FIG. 1 except that a first insulation layer 115 is disposed on an entirety of a base substrate 100 on which a semiconductor pattern 110 is disposed and that a boundary of a second insulation pattern 130 does not coincide with a boundary of the semiconductor pattern 110. Hereinafter, details of the identical elements are briefly described.

The thin film transistor substrate 200 may include a base substrate 100, a thin film transistor 170 disposed on the base substrate 100, an organic insulation layer 175 disposed on the thin film transistor 170. The thin film transistor 170 may include a semiconductor pattern 110, a first insulation layer 115, a second insulation pattern 130, a gate electrode 140, an inorganic insulation layer 150, a source electrode 161 and a drain electrode 163.

The base substrate 100 may include a transparent insulation material. Also, the base substrate 100 may include a flexible material.

The semiconductor pattern 110 may be disposed on the base substrate 100. The semiconductor pattern 110 may include a silicon material. In one exemplary embodiment, for example, the semiconductor pattern 110 may include amorphous silicon, polycrystalline silicon, etc.

The first insulation layer 115 may be disposed on an entirety of the base substrate 100 on which the semiconductor pattern 110 is disposed. The first insulation layer 115 may include a material having a high dielectric constant. In one exemplary embodiment, for example, the first insulation layer 115 may include a material having a dielectric constant greater than about 10. In one exemplary embodiment, for example, the first insulation layer 115 may include zirconium oxide ($ZrO_2$), hafnium oxide ($HfO_2$), titanium oxide ($TiO_2$), aluminum oxide ($Al_2O_3$), etc.

The first insulation layer 115 may have a single layer structure or a multiple layer structure. In one exemplary embodiment, for example, the first insulation layer 115 may include at least one layer having the high dielectric constant. Alternatively, the first insulation layer 115 may include a plurality of layers, including a first layer having the high dielectric constant, and a second layer having silicon oxide ($SiO_x$), silicon nitride ($SiN_x$), etc. and stacked on the first layer.

As mentioned above, the first insulation layer 115 having a relatively high dielectric constant may be disposed on the semiconductor pattern 110, thereby improving dispersion of electrical characteristics of the thin film transistor 170 including the semiconductor pattern 110.

The second insulation pattern 130 may be disposed on the first insulation layer 115. The second insulation pattern 130 may overlap a first end portion of the semiconductor pattern 110. The second insulation pattern 130 may include an inorganic insulation material. In one exemplary embodiment, for example, the second insulation pattern 130 may include silicon oxide ($SiO_x$), silicon nitride ($SiN_x$), silicon oxynitride (SiON), etc.

The gate electrode 140 may be disposed on the first insulation layer 115 on which the second insulation pattern 130 is disposed. A first portion of the gate electrode 140 may overlap the first insulation layer 115, and a second portion of the gate electrode 140 may overlap both the first insulation layer 115 and the second insulation pattern 130.

The inorganic insulation layer 150 may be disposed on the base substrate 100 on which the gate electrode 140 is disposed. The inorganic insulation layer 150 may cover the gate electrode 140.

A second contact hole CNT2 may be defined in the inorganic insulation layer 150 and the first insulation layer 115. The source electrode 161 may be electrically connected to the semiconductor pattern 110 through the second contact hole CNT2 (refer to FIG. 4E) penetrating the inorganic insulation layer 150 and the first insulation layer 115.

A first contact hole CNT1 may be defined in the insulation layer 150, the second insulation pattern 130 and the first insulation layer 115. The drain electrode 163 may be electrically connected to the semiconductor pattern 110 through the first contact hole CNT1 (refer to FIG. 4E) penetrating the inorganic insulation layer 150, the second insulation pattern 130 and the first insulation layer 115. The drain electrode 163 may include, for example, the same material as the source electrode 161. In the illustrated exemplary embodiment, a depth of the first contact hole CNT1 taken in the cross-sectional direction may be larger than a depth of the second contact hole CNT2 in the cross-sectional direction. The depths may be taken from a common surface, such as an upper surface of the semiconductor pattern 110.

As mentioned above, the second insulation pattern 130 may be disposed in a drain region of the thin film transistor 170, and the first contact hole CNT1 in the drain region may be deeper than the second contact hole CNT2 in the source region, thereby reducing a hot carrier through a short channel layer. Accordingly, reliability of the thin film transistor 170 may increase.

The organic insulation layer 175 may be disposed on the base substrate 100 on which the source electrode 161 and the drain electrode 163 are disposed. The organic insulation layer 175 may cover the source electrode 161 and the drain electrode 163. The organic insulation layer 175 may have a substantially flat surface.

The organic light emitting structure 190 may include a first electrode 181, an intermediate layer 185 and a second electrode 187. A pixel defining layer 183 may be disposed on the organic insulation layer 175 on which the first electrode layer 181 is disposed.

The first electrode 181 may be disposed on the base substrate 100 on which the organic insulation layer 175 is disposed. A third contact hole may be defined in the organic insulation layer 175. The first electrode 181 may be electrically connected to the drain electrode 163 through the third contact hole penetrating the organic insulation layer 175. The first electrode 181 may include, for example, a transparent electrode, a transreflective electrode, etc. In one exemplary embodiment, for example, the first electrode 181 may include IZO, ITO, zinc oxide ($ZnO_x$), tin oxide ($SnO_x$), etc.

The pixel defining layer 183 may be disposed on the organic insulation layer 175 on which the first electrode 181 is disposed. The pixel defining layer 183 may partially overlap both end portions of the first electrode 181. An opening may be defined in the pixel defining layer 183 and exposes the first electrode 181.

The intermediate layer 185 may be disposed on the first electrode 181. The intermediate layer 185 may include a HIL, a HTL, an EML, an ETL and an EIL. The first electrode 181 may provide the HIL and HTL with positive holes. The second electrode 187 may provide the ETL and EIL with electrons. The positive holes and the electrons may be coupled in the EML to generate light having a desired wavelength.

The second electrode 187 may be disposed on the intermediate layer 185 and in the opening of the pixel defining layer 183. The second electrode 187 may also overlap the pixel defining layer 183, that is, portions of the pixel defining layer 183 which define the opening therein. The second electrode 187 may include, for example, the same material as the first electrode 181.

FIGS. 4A to 4H are cross-sectional views illustrating an exemplary embodiment of a method of manufacturing the display device of FIG. 3.

Figure 4A:
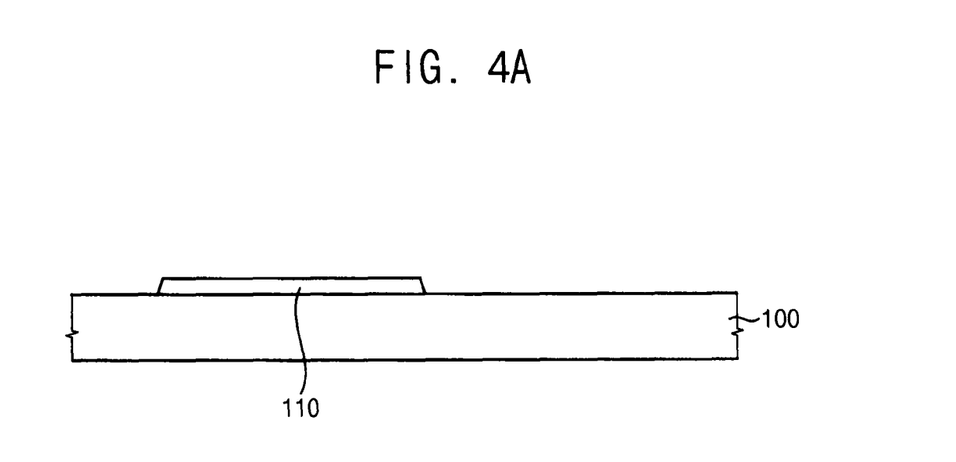
FIGS. 4A to 4H are cross-sectional views illustrating an exemplary embodiment of a method of manufacturing the display device of FIG. 3.

Referring to FIG. 4A, a semiconductor pattern 110 may be formed on a base substrate 100. The semiconductor pattern 110 may include, for example, amorphous silicon, polycrystalline silicon, etc.

Figure 4B:
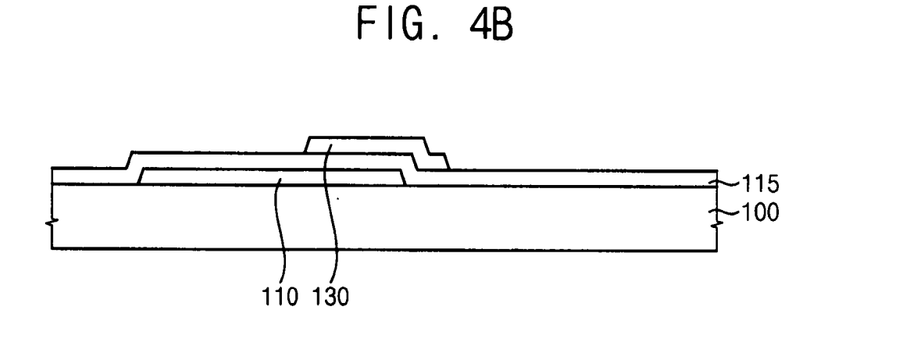

Referring to FIG. 4B, a first insulation layer 115 may be formed on the base substrate 100 including the semiconductor pattern 110 thereon. A second insulation pattern 130 may be formed on the first insulation layer 115. The second insulation pattern 130 may overlap a first end portion of the semiconductor pattern 110.

The first insulation layer 115 may include a material having a high dielectric constant. In one exemplary embodiment, for example, the first insulation layer 115 may include a material having a dielectric constant greater than about 10. In an exemplary embodiment, for example, the first insulation layer 115 may include zirconium oxide (ZrO2), hafnium oxide (HfO2), titanium oxide (TiO2), aluminum oxide (Al2O3), etc.

The second insulation pattern 130 may include an inorganic material. In one exemplary embodiment, for example, the second insulation pattern 130 may include silicon oxide (SiOx), silicon nitride (SiNx), silicon oxynitride (SiON), etc.

Figure 4C:
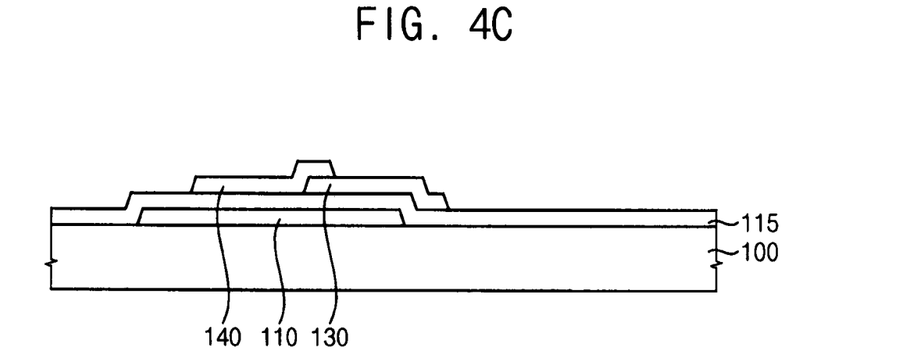
Figure 4D:
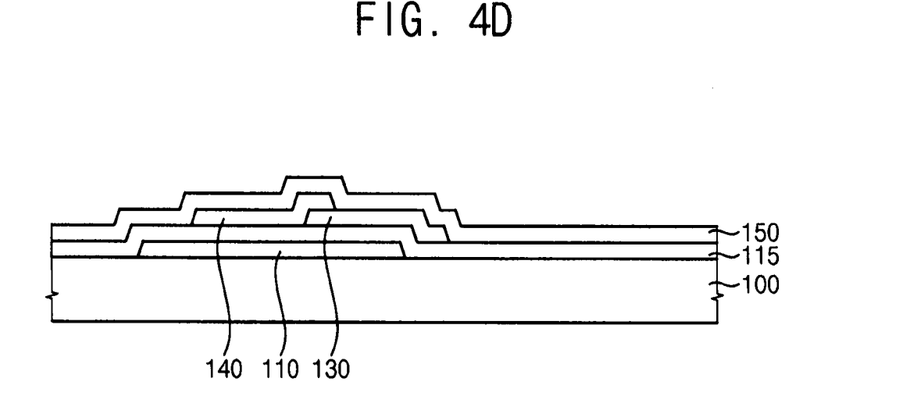

Referring to FIG. 4C and FIG. 4D, a gate electrode 140 may be formed on the base substrate 100 including the second insulation pattern 130 thereon. An inorganic insulation layer 150 may be formed on the gate electrode 140. A first portion of the gate electrode 140 may overlap the first insulation layer 115. A second portion of the gate electrode 140 may overlap both the first insulation layer 115 and the second insulation pattern 130. The inorganic insulation layer 150 may entirely cover the second insulation pattern 130 and the gate electrode 140. The inorganic insulation layer 150 may include, for example, silicon oxide (SiOx), silicon nitride (SiNx), etc.

Figure 4E:
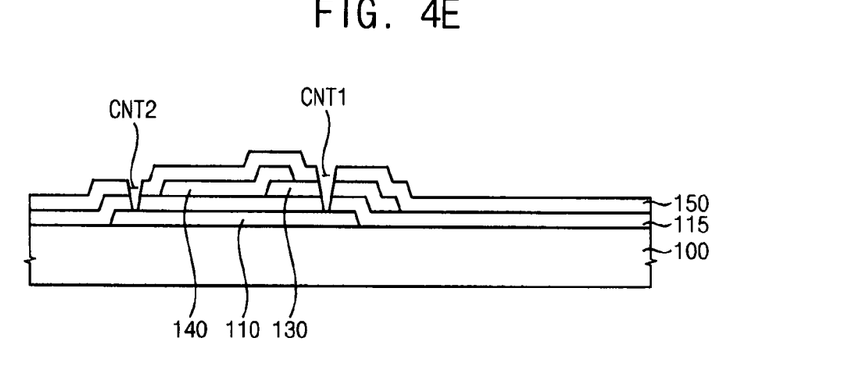
Figure 4F:
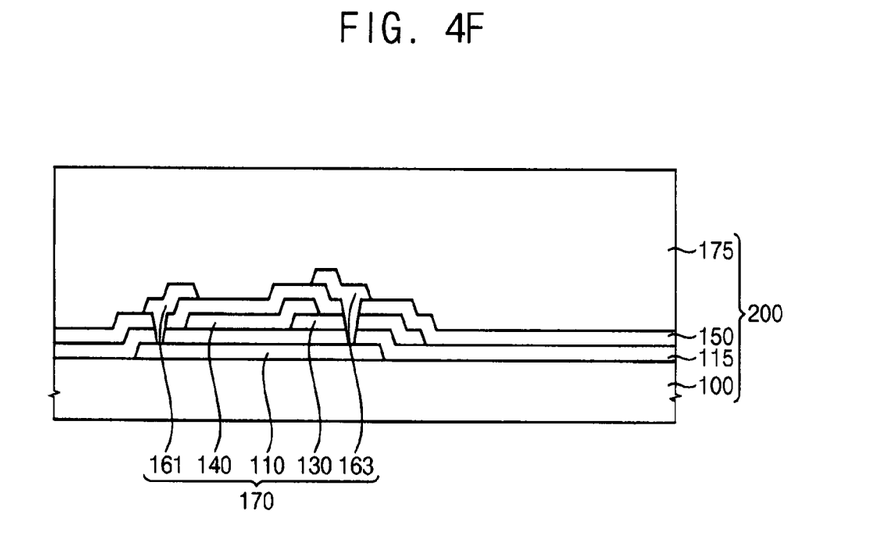

Referring to FIG. 4E and FIG. 4F, a first contact hole CNT1 and a second contact hole CNT2 each penetrating the inorganic insulation layer 150, the second insulation pattern 130 and/or the first insulation layer 115 are formed. A drain electrode 163 and a source electrode 161 may be electrically connected to the semiconductor pattern 110 through the first contact hole CNT1 and the second contact hole CNT2, respectively. An organic insulation layer 175 may be formed on the base substrate 100 including the source electrode 161 and the drain electrode 163 thereon. The drain electrode 163 may be electrically connected to a first end portion of the semiconductor pattern 110 through the first contact hole CNT1 which penetrates the inorganic insulation layer 150, the second insulation pattern 130 and the first insulation layer 115. The source electrode 161 may be electrically connected to a second end portion of the semiconductor pattern 110 through the second contact hole CNT2 which penetrates the inorganic insulation layer 150 and the first insulation layer 115. A depth of the first contact hole CNT1 may be substantially greater than a depth of the second contact hole CNT2.

Figure 4G:
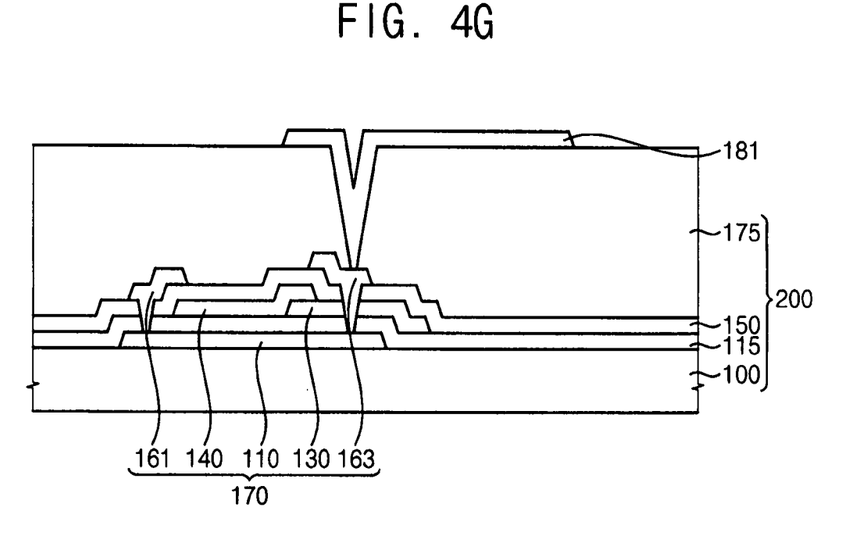

Referring to FIG. 4G, a third contact hole partially exposing the drain electrode 163 may be formed in the organic insulation layer 175, and a first electrode 181 may be formed in the third contact hole to contact an exposed portion of the drain electrode 163. The first electrode 181 may include, for example, IZO, ITO, zinc oxide (ZnOx), tin oxide (SnOx), etc.

Figure 4H:
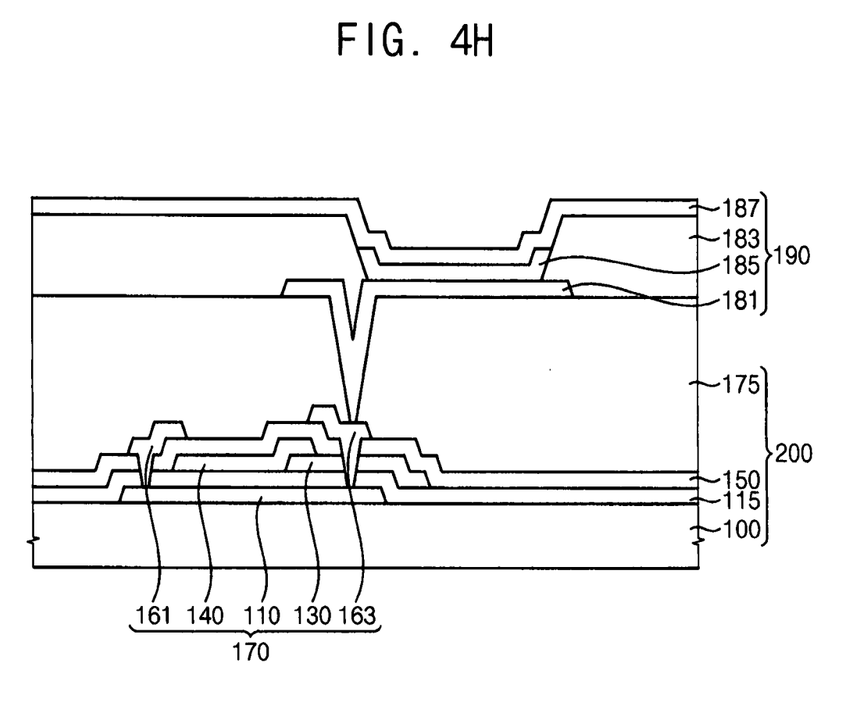

Referring to FIG. 4H, a pixel defining layer 183, an intermediate layer 185 and a second electrode 187 may be formed on the base substrate 100 including the first electrode 181 thereon. The intermediate layer 185 may include a HIL, a HTL, an EML, an ETL and an EIL. The second electrode 187 may include, for example, the same material as the first electrode 181.

As mentioned above, according to one or more exemplary embodiment of the thin film transistor substrate, the display device having the same, and the method of manufacturing the same, the first insulation layer 115 having a relatively high dielectric constant may be disposed on the semiconductor pattern 110, thereby improving dispersion of electrical characteristics of the thin film transistor 170 including the semiconductor pattern 110.

Also, the second insulation pattern 130 may be disposed in a drain region of the thin film transistor 170, and the first contact hole CNT1 in the drain region may be deeper than the second contact hole CNT2 in a source region, thereby reducing a hot carrier due to a short channel layer. Accordingly, reliability of the thin film transistor 170 may be improved.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A thin film transistor substrate comprising:
   a semiconductor pattern disposed on a base substrate;
   a first insulation member disposed on the semiconductor pattern;
   a second insulation pattern on the first insulation member, overlapping a first end portion of the semiconductor pattern and exposing a second end portion of the semiconductor pattern opposite to the first end portion; and
   a gate electrode disposed between the first and second end portions of the semiconductor pattern and extending to overlap the exposed second end portion of the semiconductor pattern,
   wherein both the second insulation pattern exposing the second end portion of the semiconductor pattern and the first insulation member are between the semiconductor pattern and the gate electrode in a cross-section.

2. The thin film transistor substrate of claim 1, wherein the first insulation member comprises a material having a dielectric constant greater than about 10.

3. The thin film transistor substrate of claim 2, wherein the first insulation member comprises at least one of zirconium oxide, hafnium oxide, titanium oxide and aluminum oxide.

4. The thin film transistor substrate of claim 1, wherein an outermost edge of the first insulation member substantially coincides with an outermost edge of the semiconductor pattern in a plan view.

5. The thin film transistor substrate of claim 1, wherein the first insulation member covers substantially an entirety of the base substrate.

6. The thin film transistor substrate of claim 1, wherein an outermost edge of a first end portion of the second insulation pattern coincides with an outermost edge of the first end portion of the semiconductor pattern in a plan view.

7. The thin film transistor substrate of claim 1, wherein the second insulation pattern comprises silicon oxide or silicon nitride.

8. The thin film transistor substrate of claim 1, further comprising:
   an inorganic insulation layer covering the gate electrode;
   a drain electrode disposed on the inorganic insulation layer and overlapping the first end portion of the semiconductor pattern; and
   a source electrode disposed on the inorganic insulation layer and overlapping the second end portion of the semiconductor pattern.

9. The thin film transistor substrate of claim 8,
wherein the drain electrode is electrically connected to the semiconductor pattern through a first contact hole defined in the inorganic insulation layer, the second insulation pattern and the first insulation member, and
wherein the source electrode is electrically connected to the semiconductor pattern through a second contact hole defined in the inorganic insulation layer and the first insulation member.

10. The thin film transistor substrate of claim 9, wherein a depth of the first contact hole is substantially greater than a depth of the second contact hole.

11. A display device comprising:
a thin film transistor substrate comprising:
   a semiconductor pattern disposed on a base substrate;
   a first insulation member disposed on the semiconductor pattern;
   a second insulation pattern on the first insulation member, overlapping a first end portion of the semiconductor pattern and exposing a second end portion of the semiconductor pattern opposite to the first end portion; and
   a gate electrode disposed between the first and second end portions of the semiconductor pattern and extending to overlap the exposed second end portion of the semiconductor pattern,
   wherein both the second insulation pattern exposing the second end portion of the semiconductor pattern and the first insulation member are between the semiconductor pattern and the gate electrode in a cross-section; and
an organic light emitting structure disposed on the thin film transistor substrate, and comprising:
   a pair of electrodes facing each other; and
   an organic light emitting layer between the pair of electrodes.

12. The display device of claim 11, wherein the first insulation member comprises a material having a dielectric constant greater than about 10.

13. The display device of claim 11, wherein an outermost edge of the first insulation member substantially coincides with an outermost edge of the semiconductor pattern in a plan view.

14. The display device of claim 11, wherein an outermost edge of a first end portion of the second insulation pattern coincides with an outermost edge of the first end portion of the semiconductor pattern in a plan view.

15. The display device of claim 11, wherein the thin film transistor substrate further comprises:
   an inorganic insulation layer covering the gate electrode;
   a drain electrode disposed on the inorganic insulation layer and overlapping the first end portion of the semiconductor pattern; and
   a source electrode disposed on the inorganic insulation layer and overlapping the second end portion of the semiconductor pattern.

16. The display device of claim 15,
wherein the drain electrode is electrically connected to the semiconductor pattern through a first contact hole defined in the inorganic insulation layer, the second insulation pattern and the first insulation member, and
wherein the source electrode is electrically connected to the semiconductor pattern through a second contact hole defined in the inorganic insulation layer and the first insulation member.

17. The display device of claim 16, wherein a depth of the first contact hole is substantially greater than a depth of the second contact hole.

* * * * *